United States Patent [19]

Fishman et al.

[11] Patent Number: 4,539,069

[45] Date of Patent: * Sep. 3, 1985

[54] PRINTED CIRCUIT BOARD COMPONENT CONVEYOR APPARATUS AND PROCESS

[75] Inventors: Herbert Fishman, Newton Center; Alvin J. Rogers, Brockton, both of Mass.

[73] Assignee: Systems Engineering & Manufacturing Corp., Stoughton, Mass.

[ * ] Notice: The portion of the term of this patent subsequent to Jun. 12, 2001 has been disclaimed.

[21] Appl. No.: 562,825

[22] Filed: Dec. 19, 1983

Related U.S. Application Data

[63] Continuation of Ser. No. 455,956, Jan. 6, 1983, Pat. No. 4,454,003.

[51] Int. Cl.³ .................. H01L 21/306; C23F 1/02
[52] U.S. Cl. ...................... 156/640; 118/314; 118/316; 118/501; 134/26; 134/32; 134/72; 134/83; 427/425
[58] Field of Search ............... 118/314, 316, 500, 501; 156/640, 650; 134/26, 32, 71, 72, 82, 83, 104, 199; 427/425

[56] References Cited

U.S. PATENT DOCUMENTS

| | | | |
|---|---|---|---|
| 1,535,024 | 4/1925 | Kranz et al. | 134/71 |
| 1,908,487 | 5/1933 | Powers | 134/72 |
| 2,358,651 | 9/1944 | McGowan | 427/425 |
| 2,646,769 | 7/1953 | Lindsay | 118/501 |
| 2,671,456 | 3/1954 | Schultz et al. | 118/500 |
| 2,823,642 | 2/1958 | Stehling | 118/316 |
| 3,509,319 | 3/1970 | Buechner | 118/500 |
| 4,371,422 | 2/1983 | Eidschun | 156/640 |

FOREIGN PATENT DOCUMENTS 62457 7/1944 Denmark ............... 134/83

Primary Examiner—John H. Newsome
Attorney, Agent, or Firm—Wolf, Greenfield & Sacks

[57] ABSTRACT

A printed circuit board conveyor apparatus has a conveyor for moving a planar circuit board components mounted on frames, in a vertical plane, seriatim, along a first path through a spray treatment area. The components are then raised and returned toward a starting point along a second path with additional processing occurring during the return trip. The use of an overhead return along with positive positioning of the components provides substantial efficiency and allows precision and accuracy in treatment of printed circuit board components while minimizing floor space requirements.

8 Claims, 4 Drawing Figures

PRINTED CIRCUIT BOARD COMPONENT CONVEYOR APPARATUS AND PROCESS

RELATED APPLICATION

This application is a continuation of U.S. patent application Ser. No. 455,956 filed Jan. 6, 1983 now U.S. Pat. No. 4,454,003.

BACKGROUND OF THE INVENTION

Printed circuit boards have come into increasing use in the electronics industry. Particularly with miniaturization, the need for high speed efficient and accurate processing of printed circuit board components has increased. Often the circuit board components start with a base sheet of insulating material which may have bound to one or both sides thereof a layer of copper. The base is often called a substrate and can take the form of epoxy, glass or various polymeric materials.

The processing steps on printed circuit board components are often carried out in conveyor apparatus along horizontal paths where various treating stations expose the board components to processing. These steps can be developing, rinsing-etching, rinsing-resist stripping-rinsing, black oxide coating, drying and the like.

Often apparatus for conveying and treating the printed circuit boards take up substantial manufacturing area space. Lines can run from ten to thirty feet in horizontal space. Problems sometimes arise in spray treating as in developing, etching, washing and stripping. The boards at stages of manufacture are often non-rigid and tend to wiggle when exposed to spray baths and the like. This can lead to non-uniformity in application of sprayed materials. Horizontally sprayed boards tend to puddle on the upper face while the lower face also tends to have non-uniform deposits formed thereon.

DESCRIPTION OF PREFERRED EMBODIMENTS

It is an object of this invention to provide a conveyor apparatus for treating of printed circuit board components rapidly and efficiently while maintaining rigid and non-rigid sheets of components in substantially non-distorted configuration during treatment.

Another object of this invention is to provide an apparatus in accordance with the preceding apparatus wherein a plurality of frames are mounted on a conveyor with the frames positively held in vertical position restraining the components against substantial lateral movement and maintaining the components at predetermined distances from spray apparatus located on either side of the components.

Still another object of this invention is to provide an apparatus in accordance with any of the preceding objects which provides for efficient operation with conveyance of a plurality of components toward and away from a starting point to minimize space needs in manufacture.

Still another object of this invention is to provide methods for efficiently processing printed circuit components as in the apparatus of this invention.

According to the invention a printed circuit board conveyor apparatus has a spray treatment line and moves a substantially planar circuit board component along the line with the component having first and second sides exposed to the spray. The component along with a plurality of seriatim arranged similar components moves along a first substantially horizontal path at a first level, from a starting point to a distant point, and then back toward the starting point at a second level in a second path. The apparatus has a frame means for mounting the circuit board components for movement away from the starting point. Liquid spray and air spray means are positioned on either side of the path at the first level for uniformly spraying the circuit board sides with liquid to carry out a printed circuit processing step with air spray preferably between selected processes. A conveyor guide means contacts the frame means in supporting relationship therewith to maintain a predetermined position of the frame and fixed position of the circuit board component mounted thereon to aid in uniform application of liquids by the liquid spray means. Preferably conveyor guide means prevents movement of the circuit board component more than one inch out of vertical predetermined position. A conveyor drive means mounts the frame means for moving the circuit board in the first and second path at a first and second level respectively with the second level being above the first level whereby the board can be returned to the starting point by the conveyor means. Preferably the frame means are mounted vertically and with the plane of the printed circuit boards substantially parallel and in line with the first and second path.

According to a method of this invention, printed circuit board components are treated seriatim in a plurality of spraying stations. The boards are mounted seriatim on a first conveyor with frame means for movement along a first path, at a first level, from a starting point to a distant point. Then upward movement moves the frame means to a second path returning toward said starting point at a level raised above said first path. The components are fixed to a plurality of frames of the frame means by releasable means with the components held against sway from the vertical path by positive means at upper and lower portions of the components. The components are advanced along the first and second path so that a single operator can operate the method with a high degree of precision with respect to spray treatments of the components at the path with little movement of the components except in the direction of the path.

It is a feature of this invention that since the boards are positively held in a releasable frame, even though they may be non-self-supporting, they will be substantially planar when subjected to spray by the spray means, thus allowing even and uniform coatings. This increases precision and accuracy of completed printed circuit boards. Since the overhead return is used, space saving is maximized and a single operator can both load and unload the frames. Significant space saving and increased precision can be obtained in all spray treatments including etching, outer layer formation, solder formation, basic processing, cleaning, rinsing and drying. High speed conveyors such as five feet per minute conveyor speeds can easily be obtained with production of one hundred and fifty boards per hour in spray machines easily possible.

BRIEF DESCRIPTION OF THE DRAWINGS

The above and other objects, features and advantages of the present invention will be better understood when read in conjunction with the attached drawings in which.

DESCRIPTION OF PREFERRED EMBODIMENTS

Figure 1:
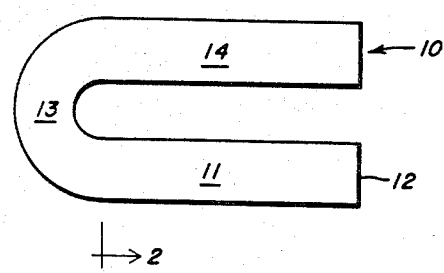
FIG. 1 is a semi-diagrammatic side view of a preferred printed circuit board component conveyor in accordance with this invention.
Figure 4:
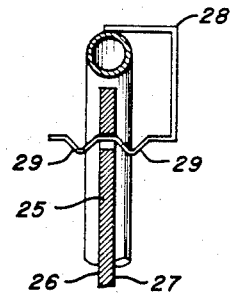
FIG. 4 is a semi-diagrammatic cross-section of a component thereof in fragmented form taken through line 4—4 of FIG. 3.
Figure 2:
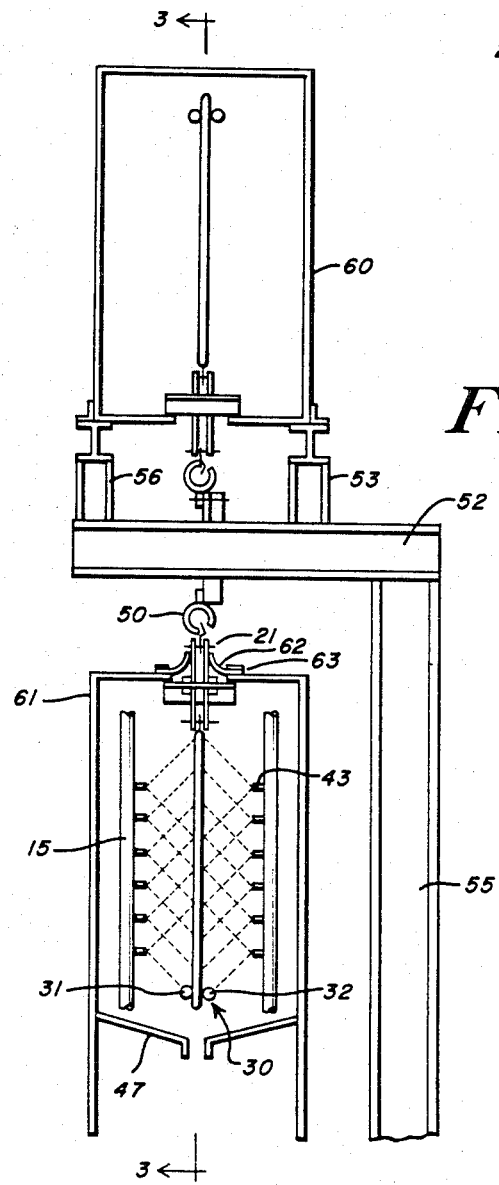
FIG. 2 is a semi-diagrammatic cross-section thereof taken through line 2—2.
Figure 3:
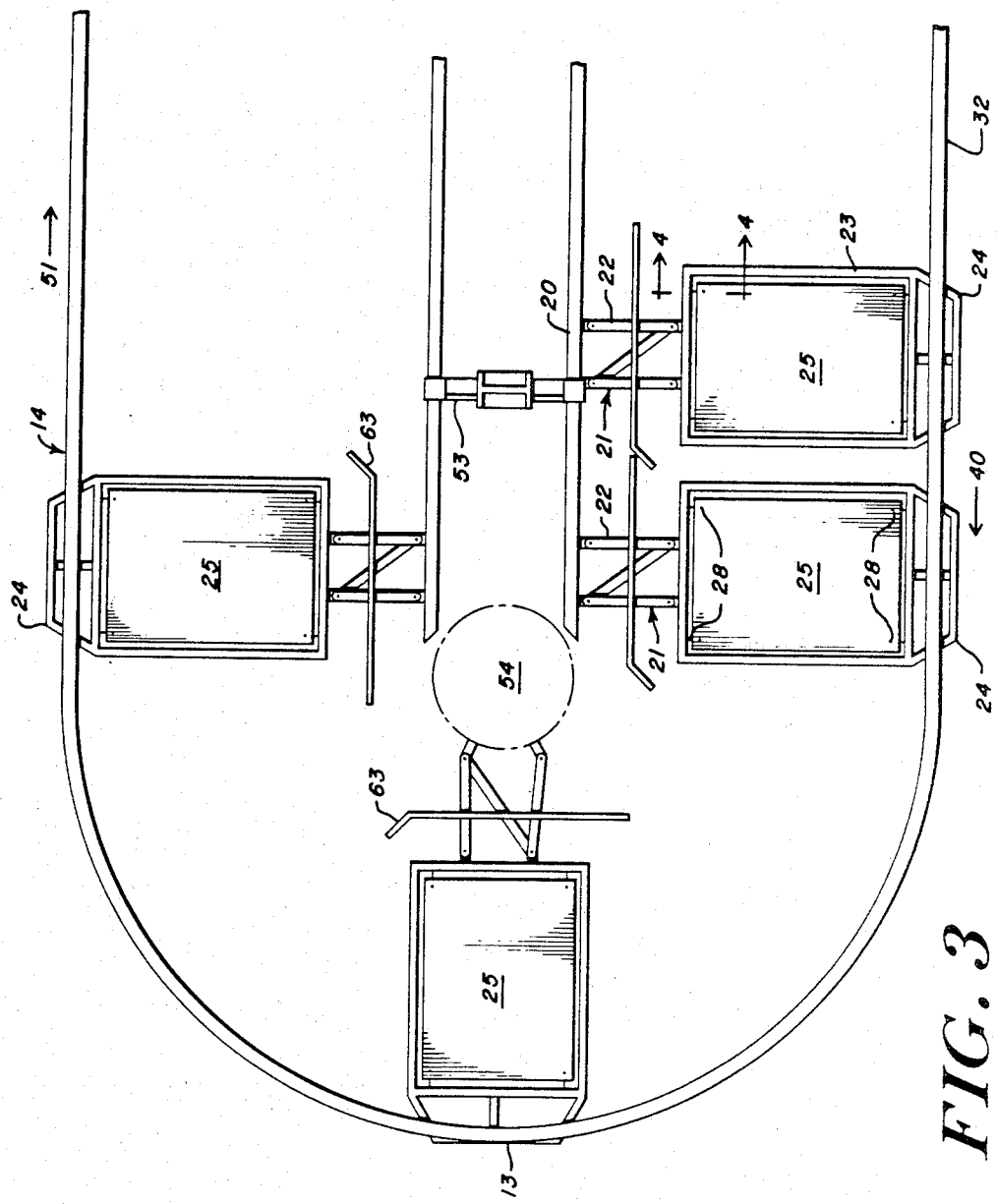
FIG. 3 is a further semi-diagrammatic cross-section taken through line 3—3 of FIG. 2.

With reference now to the drawings, a printed circuit board conveyor apparatus is semi-diagrammatically illustrated in FIGS. 1 through 3, at 10. The apparatus has a first horizontal path 11 from a starting point or end 12 to a distant point 13 with an upper second path 14 returning toward the starting point 12 and raised thereabove.

The apparatus 10 can have one or more treating stations along the first path 11. The treating stations can be one or more liquid spray means 15 acting at one or more points along path 11. A plurality of spray treatments such as washing and rinsing can be used with air knives between each treating station as known in the industry.

In the apparatus 10, the conveyor drive means 20 extends along the first and second path and carries a plurality of seriatim arranged frame means 21 each having a hanger section 22 and a peripheral frame substantially planar section 23 with a lower blade section 24.

The peripheral section 23 is in fact a frame. This frame is preferably made of tubular material such as 3/16" diameter stainless steel round wire of 304 stainless steel, titanium, polypropylene, polyvinylchloride or the like. Round cross sections for the frame are preferred since minimized trapping of solution occurs with minimized surface area. Of course the cross section, material and size of the frames can vary greatly depending on the components to be processed.

Each frame 23 is designed to hold a printed circuit board component 25 with a plurality of such boards being shown in a plurality of seriatim arranged frames at FIG. 3. The boards are preferably surrounded by the frames although other arrangements are possible.

The components 25 can for example be plain copper sheet having a front side and a rear side 26, 27 respectively and/or as is more often the case in treating, thin copper sheets with substrates of resin impregnated fiberglass or the like. Such components 25 are often non-rigid but self-supporting. They tend to wiggle when laid horizontally. On the other hand, they can be mounted removably on conventional hanger pins such as wire spring pins 28 located at four corners of each frame to rigidify the board components and keep them substantially planar in a vertical plane when moving along the first and second path in the apparatus. The hanger pins 28 can have spaced V-shaped indentations 29 to maintain the boards against side-to-side movement within each frame 23. It is important that the frames be held substantially rigid in the frame, but without stretch or distortion, to allow the force of spray means to apply substantially uniform liquids at all points along the surfaces on either side of the board component. The particular mounting pins and frame shapes can vary.

Because of the desirability of uniformity of spray, it is important that the frame itself be maintained substantially vertical and preferably sway no more that about one inch from side to side as it moves along the track. This is accomplished by means of a conveyor guide means 30 having guide rails 31 and 32 within which a lower blade section 24 of each frame is mounted. Thus as frames move along the first path in the direction of arrow 40, they are maintained in substantially vertical alignment by the hanger section 21 and the frame blade sections 24. The blade sections 24 maintain the frames in vertical position even as they rise at the distant point 13 to the upper path at the second level as at 14.

Below the conveyor guide means 30, formed by the rails 31 and 32, is a funnel trough 41 below which a catch basin can be positioned along the length of the first path to catch fluids from the spray heads. Trough 41 can be eliminated if desired.

The liquid spray means 15 as known in the art can be banks of spray heads such as 43 to provide a uniform spray of solution to the printed circuit board components 25. Preferably both sides are sprayed in normal processing as in cleaning. It is important that the positioning remain constant from the spray heads to the board. The guide rail means and hanger means act in conjunction to provide proper distancing between boards and between the boards and spray heads.

As will be understood, although only one spray section is shown in FIG. 2, spray treating stations can be positioned before the section of FIG. 2 along the first path with a plurality of different spraying solutions used if desired. Air spray knife blade mechanisms can be used to separate one section from another by air sprays.

The conveyor drive means 20 can be a link belt or other conventional endless conveyor drive for mounting the frames, as diagrammatically shown at 50, and moving them along the first and second paths shown at arrows 40 and 51. The drive means is mounted on a standard frame 52 formed of I-beams, with upper and lower supports of steel 53, 55, 56 and end capstans such as 54 (only one shown). Each treating station is preferably surrounded by a casing section of panels as indicated broadly at 60 in the second path and 61 in the first path. A drip shield 63 is mounted on the hanger section above each frame means so that as the frame means move along the path and are carried upwardly, liquids dripping from the board are caught and conveyed to a desired location. This is particularly desirable in the upper level travel where drippings may tend to contaminate lower boards unless drip shields are provided. The drip shields can be interconnected with tanks or just remain as holding bins if desired. The drip shields can be planar sheets of plastic or metal with raised lips on one or more sides.

Preferably the second path is used for dry operations such as drying stations. Thus the problems of liquid treating in overhead paths are avoided.

Preferably each compartment such as 60, 61 has a sliding seal as by a hard rubber shoe 62 slipping between a sliding surface 63 allowing the hanger sections to travel along with the compartment 60, 61 being stationary. The seal which minimizes fumes to the environment can be in the form of a curtain or drape.

In a typical apparatus for developing printed circuit board components in a method in accordance with this invention, a printed circuit board conveyor apparatus as for example shown at 10 in FIG. 1 is set up to act as a developer. The first horizontal path at ground level is preferably about nine feet from starting point 12 to distant point 13 and is broken into three modules comprising a first developer module, a second rinse module and a third rinse module being four feet, two feet six inches and two feet six inches respectively in horizontal length. These modules can actually be one elongated compartment. The modules are preferably separated by air knife means which comprise vertical pipes as for example sixty inches tall carrying one-eighth inch holes mounted at forty-five degree angles to the plane of travel of the frames. The holes can be spaced from top to bottom to provide sufficient air blast to clear liquids from the frames as they move from one module to another along the path 11 from the point 12 to 13 and back toward the starting point 12 on the upper run.

In each module, there is a series of spray heads such as 43 comprising in each module seven heads vertically arranged at approximately six-inch spaces with five rows to provide thirty-five nozzles on each side of the frame paths in each of the modules. Each of the nozzles can for example have a 6.9 inch cone circle of spray and are positioned six inches from each face of the board on either side thereof to deliver 0.89 grams per minute at twenty psi per nozzle.

In the developer module, printed circuit boards which may comprise for example boards having dimensions of twenty-four inches by thirty-six inches with the long side of the rectangle being positioned vertically are each positioned and held in individual frames. The frames are vertically mounted as previously described with the copper boards carrying a plastic pattern thereon when they enter the developer module first in line in the pathway 14. The soft plastic of the pattern is removed by the developer which can be a spray of sodium carbonate admixed with butyl carbitol as known in the printed circuit industry. The two rinse steps are carried out in the two remaining modules which have spray head arrangements for spraying pure water (tap water in most localities) to clear the developer are used. The upper drying chamber can be a conventional drying chamber with a steam core and fan to move 140° to 160° F. heat from the core passed to both faces of the printed circuit boards at approximately 110° F. When the boards are moved through the apparatus at a rate of 1.2 feet per minute the apparatus can easily carry out developing and rinsing of thirty-two panels per hour.

The panels after the developing step in the apparatus 10 can be further processed in another apparatus such as 10, to carry out an etching step to reduce the copper surface. Further conventional processing such as stripping of the resist can be carried out later. The apparatus of this invention can have the spray heads set up to carry out other steps than developing as for example etching or resist removal and the like.

While a specific apparatus has been described, many variations are possible. The number of spray stations can vary. In certain cases other drying and treating stations can be used on the upper and lower path in addition to spray and drying stations. The particular frame means can vary although in all cases the frame is substantially vertically held and preferably aligned with the planes of each board component treated preferably substantially traveling in a single plane. In some cases, the plane of each board may be somewhat at an angle to the path of travel although planar movement of the board as described is preferred to enhance ease of uniform application of spray fluids to the boards. Blade type positioning means are preferred for sliding contact to keep the boards aligned while preventing the board components from moving out of the path of travel by any substantial degree. The frame means preferably substantially rigidify the board components. The particular developer solution used can vary as known in the art. Etchants used can be sulfuric acid, cupric chloride or other known etchants. The resist stripping fluids can be as known in the art. The particular spray head arrangement as well as flow, times, and sizes of material can also vary greatly as known in the art. Speed of production can vary with the conveyor size, guide rail construction and distances to be traveled. While non-rigid boards are preferably treated with the spray means since such non-rigid boards are customarily used in the printed circuit art, in some cases the boards are substantially rigidified and final processing steps carried out on rigid boards.

What is claimed is:

1. A printed circuit board conveyor apparatus comprising a spray treatment line for moving a substantially planar circuit board component having first and second sides along a first path from a starting point to a distant point, said apparatus comprising a frame means for mounting said circuit board component for movement away from said starting point along said first path to said distant point, said frame means extending so as to support each said component in a substantially vertical plane with a component being mounted on each frame means and each frame means comprising a blade means for engaging a guide rail in sliding contact therewith to maintain movement of said frame in a plane, liquid spray means positioned on either side of said path for uniformly spraying said circuit board sides with liquid to carry out a printed circuit processing step, conveyor guide means for contacting said frame means in supporting relationship therewith to maintain a predetermined position of the frame and fixed position of said circuit board mounted thereon to aid in uniform application of liquids by said liquid spray means, and a conveyor drive means mounting said frame means for moving said circuit board in said first path.

2. A printed circuit board conveyor apparatus in accordance with claim 1 wherein said frame means each comprise a tubular frame lying substantially in a plane, each frame means having releasable means for mounting a rigid or non-rigid printed circuit board component member thereon, each frame means further comprising outwardly extending blade means for engaging a guide rail in sliding contact therewith for movement in said plane.

3. A printed circuit board conveyor apparatus in accordance with claim 2 wherein said frame means comprises a generally rectangular frame having an extension portion adapted to be positioned between first and second guide rails and a hanger section opposite said blade portion.

4. A printed circuit board conveyor apparatus in accordance with claim 3 and further comprising a drip shield positioned on said frame means for preventing downward flow of fluids from said frame means.

5. In an apparatus for conveying a plurality of printed circuit boards along a first path at a first level, the improvement comprising, a frame carrying a printed circuit board, said frame defining an outer support perimeter, a top hanger section and a lower blade section with said board being substantially arranged in a plane, said frame carrying means for supporting a planar printed circuit board component in releasable engagement therewith while being mounted to prevent movement of said board from a predetermined plane while exposed to a plurality of processing conditions.

6. The improvement of claim 5 and further comprising said frame having a round cross section.

7. The improvement of claim 5 and further comprising a drip shield mounted at said top section for preventing dripping of liquids from said frame to a directly underlying area.

8. A frame for use in conveying a plurality of printed circuit boards vertically arranged along a path, said frame defining an outer support perimeter, a top hanger section and a lower blade section with said board being substantially arranged in a plane, said frame carrying means for supporting a planar printed circuit board component in releasable engagement therewith while said board is mounted to prevent movement of the board from a predetermined plane while exposed to a plurality of processing conditions, said lower blade section being adapted to move along a straight line path in sliding engagement with a guide rail.

* * * * *